(12) United States Patent
Bhatt et al.

(10) Patent No.: US 6,225,028 B1
(45) Date of Patent: May 1, 2001

(54) METHOD OF MAKING AN ENHANCED ORGANIC CHIP CARRIER PACKAGE

(75) Inventors: Anilkumar Chinuprasad Bhatt, Johnson City; Thomas Richard Miller, Endwell; Allen Frederick Moring, Vestal, all of NY (US); James Paul Walsh, Vandling, PA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/482,548

(22) Filed: Jan. 13, 2000

Related U.S. Application Data

(62) Division of application No. 09/042,898, filed on Mar. 17, 1998.

(51) Int. Cl.⁷ ........................................................ G03F 7/00
(52) U.S. Cl. ............................................. 430/311; 430/313
(58) Field of Search ..................................... 430/311, 313

(56) References Cited

U.S. PATENT DOCUMENTS

| | | |
|---|---|---|
| 4,211,563 | 7/1980 | Goldman . |
| 4,237,210 | 12/1980 | Dougherty . |
| 4,259,421 | 3/1981 | Goldman . |
| 4,773,955 | 9/1988 | Mabuchi et al. . |
| 4,985,601 | 1/1991 | Hagner . |
| 5,022,960 | 6/1991 | Takeyama et al. . |
| 5,048,179 | 9/1991 | Shindo et al. . |
| 5,098,526 | 3/1992 | Bernhardt . |
| 5,102,829 | 4/1992 | Cohn . |
| 5,137,618 | 8/1992 | Burnett et al. . |
| 5,142,448 | 8/1992 | Kober et al. . |
| 5,144,534 | 9/1992 | Kober . |
| 5,175,060 | 12/1992 | Enomoto et al. . |
| 5,209,817 | 5/1993 | Ahmad et al. . |
| 5,285,352 | 2/1994 | Pastore et al. . |
| 5,288,542 | 2/1994 | Cibulsky . |
| 5,397,917 | 3/1995 | Ommen et al. . |
| 5,422,513 | 6/1995 | Marcinkiewicz et al. . |
| 5,542,175 | 8/1996 | Bhatt et al. . |
| 5,566,448 | 10/1996 | Bhatt et al. . |
| 5,599,747 * | 2/1997 | Bhatt et al. ........................ 437/209 |
| 6,110,650 * | 8/2000 | Bhatt et al. ........................ 430/313 |

* cited by examiner

*Primary Examiner*—Hoa Van Le
*Assistant Examiner*—Amanda C. Walke
(74) *Attorney, Agent, or Firm*—Ratner & Prestia; Larry R. Fraley

(57) ABSTRACT

A method of making a circuitized substrate wherein a chip-accommodating cavity is formed along with a plurality of conductive elements (e.g., pads, lines, etc.) which form part of the substrate's circuitry. Metallization is facilitated by the use of a photoimageable member that allows for initial removal (peeling) of its sacrificial layer, followed by eventual removal of the photoimaging layer which also forms part of this member. Exposure of the photoimaging layer may occur either through the protective sacrificial layer or subsequent removal thereof.

34 Claims, 7 Drawing Sheets

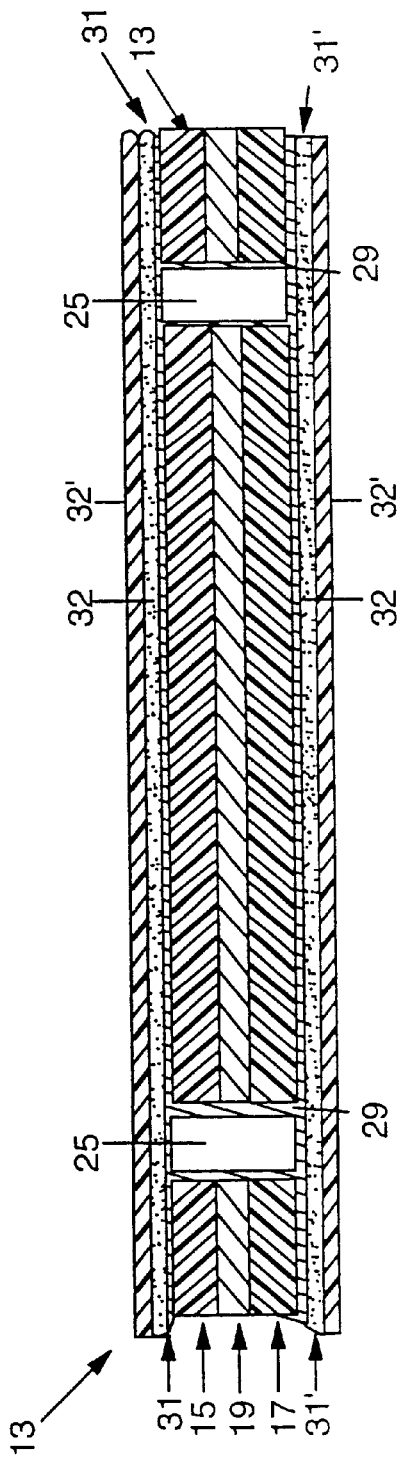
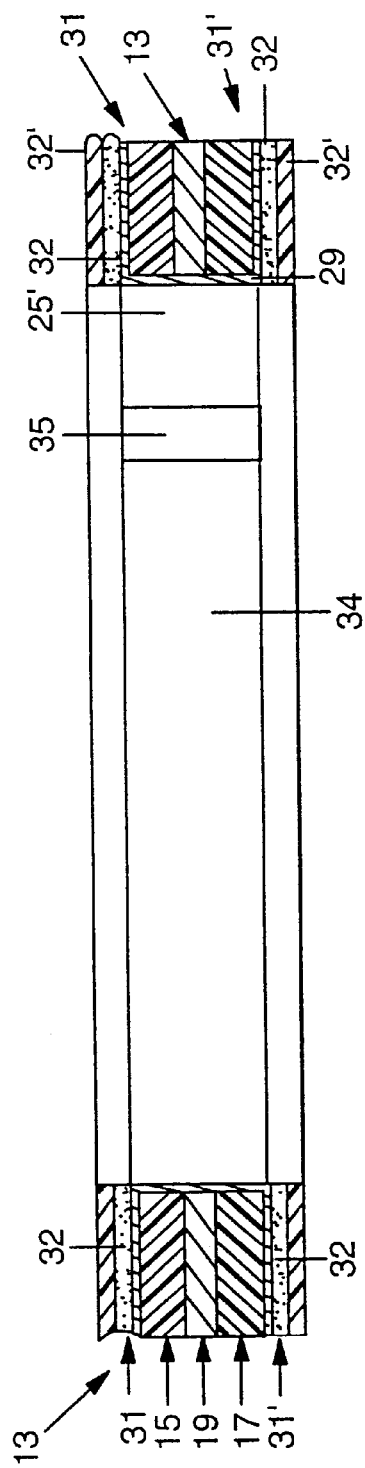
FIG. 4
FIG. 5

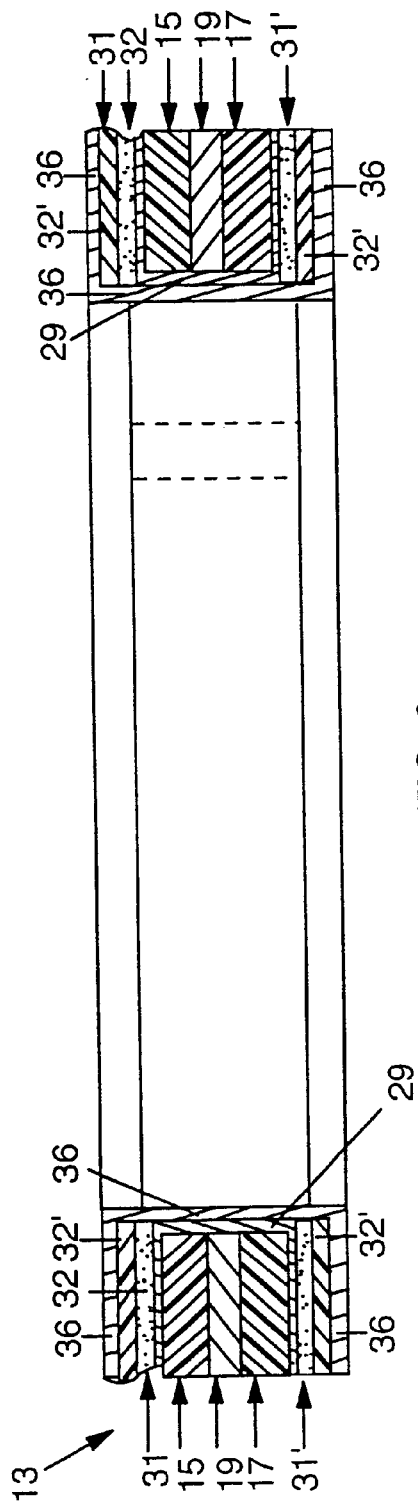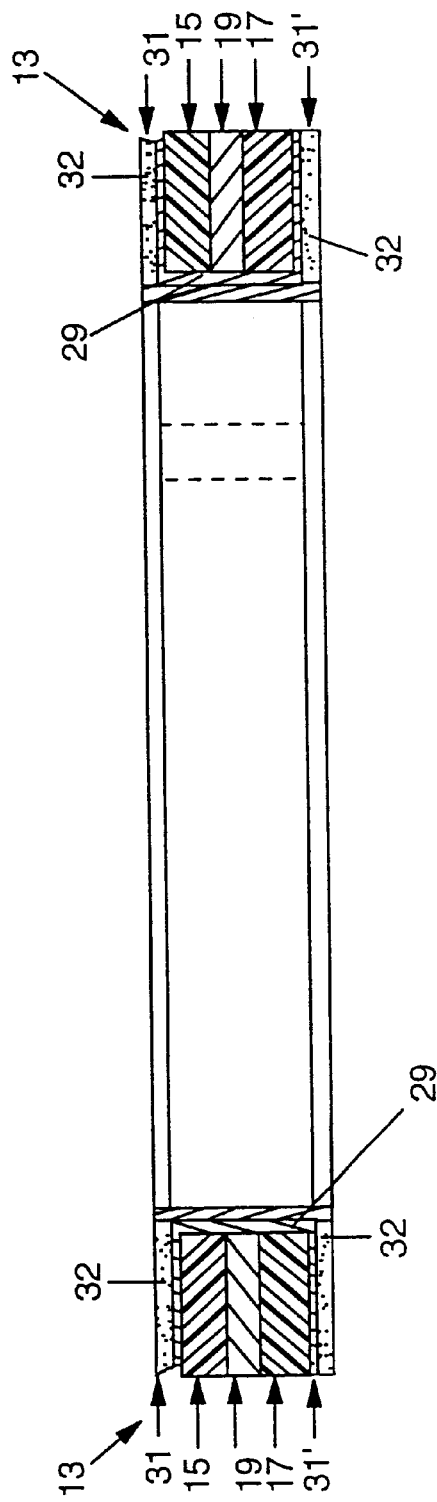

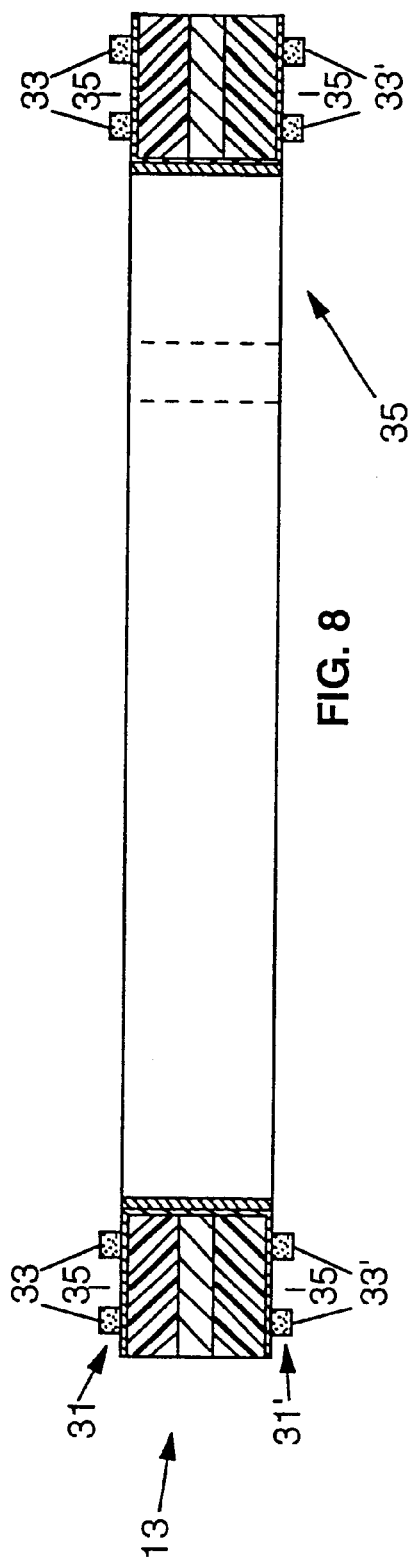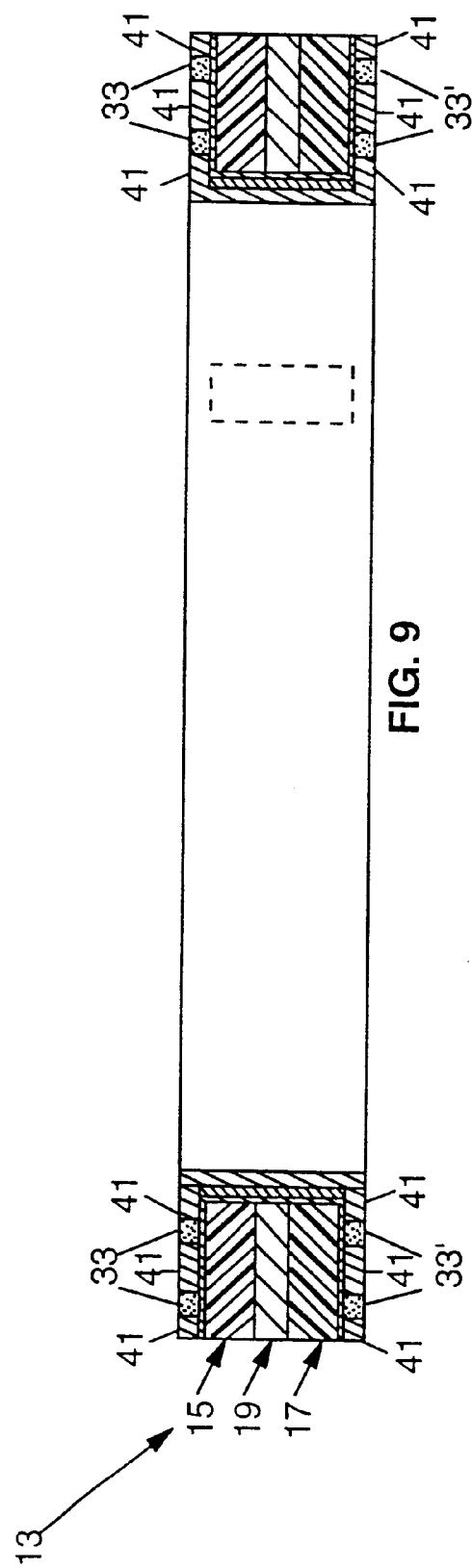

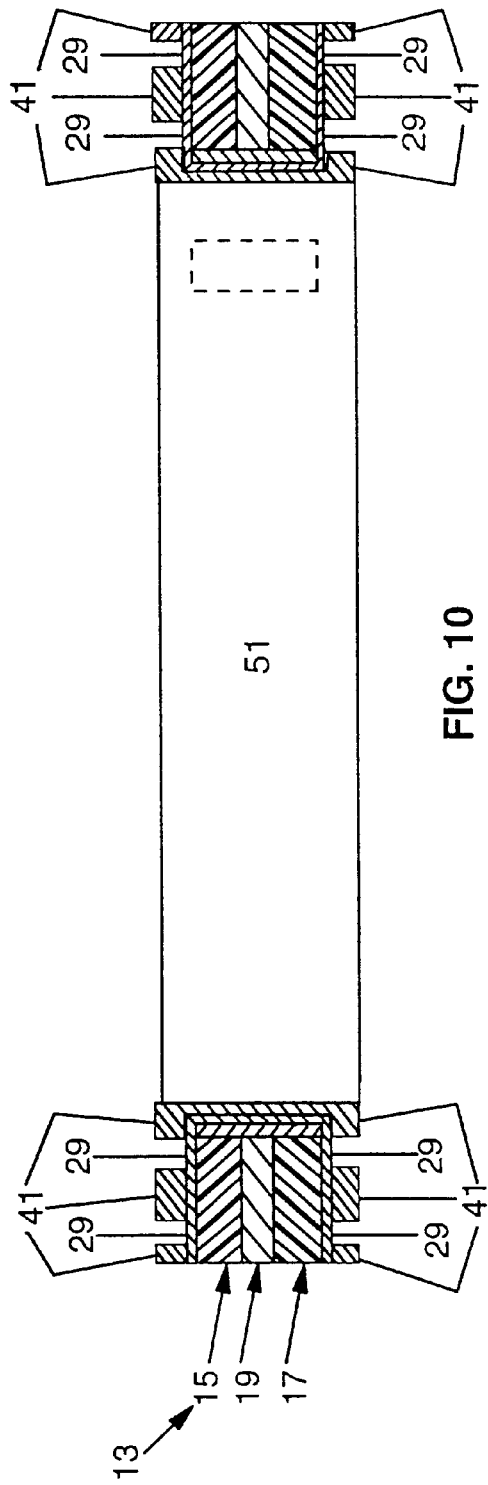
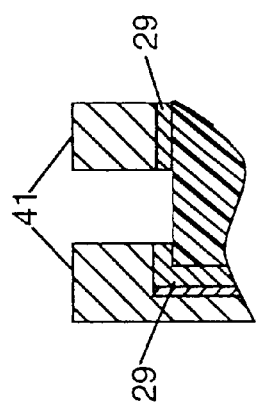
FIG. 10
FIG. 10A

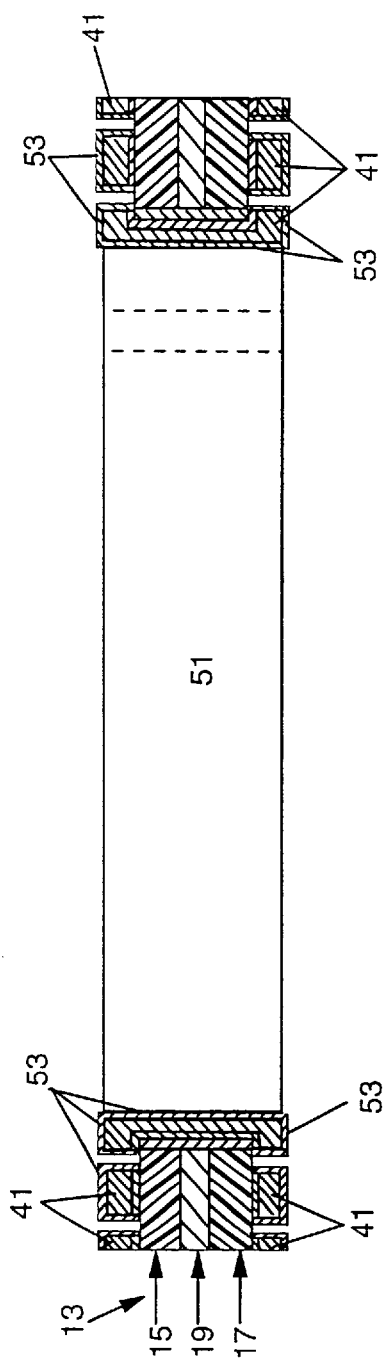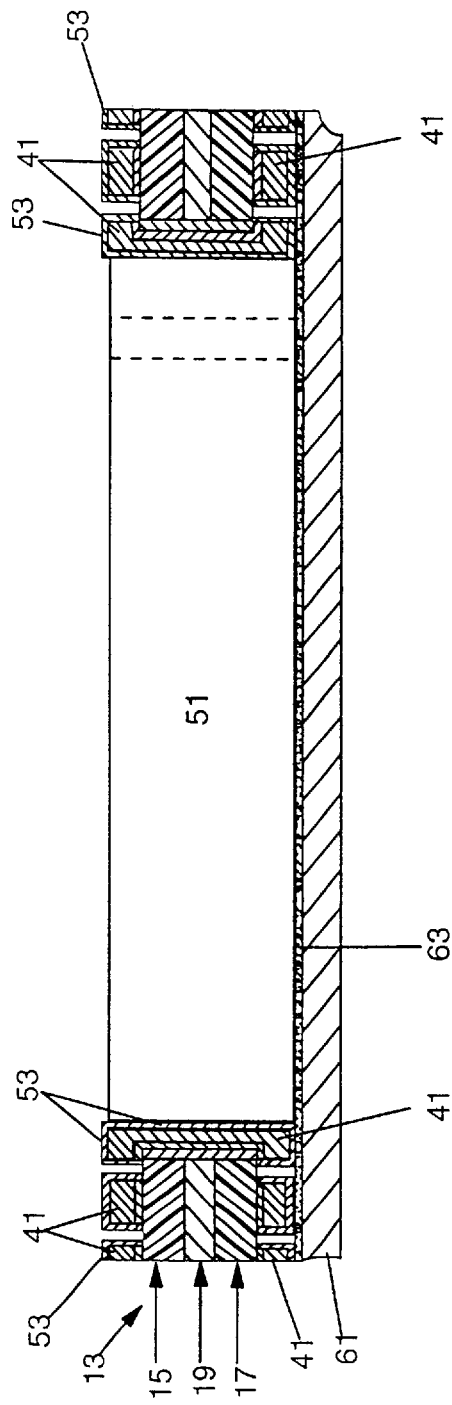

METHOD OF MAKING AN ENHANCED ORGANIC CHIP CARRIER PACKAGE

This application is divisional of U.S. patent application Ser. No. 09/042,898, filed on Mar. 17, 1998, which is pending.

TECHNICAL FIELD

The invention pertains generally to circuitized substrates and particularly to chip carriers for integrated circuits (semiconductor chips).

CROSS-REFERENCE TO COPENDING APPLICATIONS AND PATENTS

In Ser. No. 08/495,248, now U.S. Pat. No. 5,599,747, entitled "Method Of Making Circuitized Substrate" and filed Jun. 27, 1995, there is defined a process for making a circuitized substrate wherein a temporary support portion is formed and removed, leaving at least of the formed cavity's sidewalls not including metallization thereon following the removal.

In Ser. No. 08/359,491, now U.S. Pat. No. 5,542,175, entitled "Method Of Laminating And Circuitizing Substrates Having Openings Therein" and filed Dec. 20, 1994, there is defined a method of laminating two substrates and circuitizing at least one of these. A plug is provided and shaped to fit within an opening defined in the structure, and then removed following lamination and circuitization.

In Ser. No. 08/390,344, entitled "Organic Chip Carriers For Wire Bond-Type Chips", filed Feb. 15, 1995, there is defined a chip carrier having a single-tiered cavity within a dual layered (of organic material) substrate and a semiconductor chip located in the cavity. The chip is wire bonded to circuitry on the substrate.

In Ser. No. 08/470,389, now U.S. Pat. No. 5,566,448, entitled "Method Of Construction Of Multi-Tiered Cavities Used In Laminate Carriers", filed Jun. 6, 1995, there is defined a method of forming a chip module wherein a rigid cap and substrate are used, the cap and substrate laminated together with bond pads connected to circuitry disposed in a bottomed cavity of the cap. Following cap circuitization, part of the cap (that over the cavity) is removed and a semiconductor chip coupled to the circuitry.

In Ser. No. 08/820,995, filed Mar. 20, 1997 and entitled "Method Of Making A Circuitized Substrate", there is defined a method of making a circuitized substrate using a removable film layer. It is understood that the presently claimed invention represents an alternative, enhanced version of the method in Ser. No. 08/820,995.

The above pending application and patents are assigned to the same assignee as the present invention. The teachings of these documents are incorporated herein by reference.

BACKGROUND OF THE INVENTION

It is known that integrated circuit devices (hereinafter referred to as semiconductor chips) are typically electronically packaged by mounting one or more chips onto a dielectric, e.g., alumina, circuitized substrate (referred to as a chip carrier), with wire bonds used to electrically connect I/O (input/output) contact pads on each chip to corresponding contact pads (and therefore to corresponding fan-out circuitry) on the circuitized chip carrier substrate. Wire bonding is a well known process in the art and further description is not believed necessary. The resulting chip carrier is then typically mounted on a printed circuit board (PCB) and, using circuitry on the PCB, electrically coupled to other such chip carriers and/or other electronic components mounted on the PCB.

Ceramic chip carrier structures have proven extremely useful in the electronic packaging field. However, the use of ceramic as the dielectric material of the substrate does present certain limitations and drawbacks. For example, the speed of propagation of an electrical signal through a conductive wire located on a dielectric layer (or between two dielectric layers for that matter) is proportional to the inverse of the square root of the dielectric constant of the dielectric material layer or layers. As is known, the dielectric constants of most ceramics are relatively large, e.g., the dielectric constant of alumina (the primary constituent of ceramic materials used in these substrates) is relatively high, which results in ceramic chip carriers exhibiting relatively low signal propagation speeds in comparison to substrates of other (e.g., organic) materials, such as fiberglass-reinforced epoxy resin, polytetrafluoroethylene, etc.

Ceramic chip carrier usage also presents certain input/output (I/O) constraints. For example, a single-layer ceramic chip carrier substrate includes but a single layer of fan-out circuitry on the upper surface of the ceramic substrate, extending to contact pads around the outer periphery of the substrate. A lead frame, having inner leads connected to these peripheral contact pads, is typically used to electrically connect such a ceramic chip carrier to a printed circuit board (PCB). As the number of chip I/Os has increased (in response to more recent enhanced design requirements), it has been necessary to increase the wiring density, sometimes to the point where undesirable cross-talk between adjacent wires may occur. Further, it has become increasingly difficult to form a correspondingly large number of contact pads around the outer periphery of the ceramic substrate. Accordingly, it is understood that single-layer ceramic chip carrier substrates are limited in the ability thereof to accommodate semiconductor chips with significantly increased I/O counts as required in today's packaging designs.

Efforts to accommodate semiconductor chips having relatively large numbers of I/O pads have led to the use of multilayer ceramic chip carrier substrates utilizing what are referred to as "ball grid arrays" (BGAs) in lieu of lead frames. Such multilayer types of ceramic chip carrier substrates differ from single-layer ceramic chip carrier substrates in that these include two or more layers of fan-out circuitry on two or more ceramic layers. Significantly, these layers of fan-out circuitry are electrically interconnected by mechanically drilled holes (called "vias"), which are plated and/or filled with electrically conductive material (e.g., copper). In addition, a certain number of such holes extend from the layers of fan-out circuitry to respective lands on the chip carrier substrates, on which are mounted solder balls (formed in grid arrays, hence the term "ball grid array"). These solder balls are intended to be mechanically and electrically connected to corresponding solderable contact pads on a receiving substrate, e.g., PCB. Unfortunately, the mechanically drilled holes electrically interconnecting the layers of fan-out circuitry have relatively large diameters, requiring the spacing between the fan-out wires to be relatively large. This relatively large spacing between fan-out wires understandably limits the number of chip I/O pads which can be accommodated.

Additional efforts to package chips having a relatively large number of chip I/O pads have led to the use of multi-tiered cavities in multi-layered ceramic substrates. When using such a packaging configuration, a chip is mounted face-up (its I/O pads facing upwardly) at the bottom of a multi-tiered cavity. Wire bonds (e.g., using fine gold wire) are extended from the I/O contact pads on the exposed upper surface of the chip to respective contact pads on the exposed upper surfaces of the different layers of the multi-layered ceramic substrate. While this configuration does make it possible to accommodate a relatively large number of chip I/O pads, it unfortunately typically mandates usage of multiple manufacturing set-up operations to accommodate the different tier height for the relatively long wire bonds extending from the chip to the spaced tiers.

Typically, ceramic chip carrier substrates are also limited in heat dissipation capabilities. For example, in the case of a multilayer ceramic chip carrier having a chip positioned at the bottom of a multi-tiered cavity, heat dissipation is typically achieved by providing a heat sink directly beneath the cavity. This implies, however, that the heat generated by the chip must necessarily be conducted through the ceramic layer at the bottom of the cavity before reaching the heat sink. As a consequence, effective heat dissipation is hampered.

The present invention, as defined herein, teaches an improved method for making a circuitized substrate capable of overcoming the aforementioned drawbacks of other such products. This method is uniquely adaptable for use with many existing manufacturing apparatus (e.g., wire bond and photoimaging equipment) without extensive alteration thereof and can thus be used on a mass production basis to enjoy the benefits thereof.

Different methods for making circuitized substrates are described in U.S. Pat. No. 5,022,960 (Takeyama et al), U.S. Pat. No. 5,142,448 (Kober et al), U.S. Pat. No. 5,144,534 (Kober) and U.S. Pat. No. 5,288,542 (Cibulsky et al). In U.S. Pat. No. 5,022,960, a laser beam is used to remove a selected portion of a substrate (12) which eventually accommodates a semiconductor chip (20) positioned on a metal layer (11) also attached to the substrate. In U.S. Pat. No. 5,142,448, there is described the step of compression molding several dielectric layers to form a laminate. Flexibility of certain parts of the board is attained by the provision of slots, and a "plug" is located for occupying the defined flexible region. In U.S. Pat. No. 5,144,534, a method of making rigid-flexible circuit boards is described in which a removable plug is used in the PCB during processing and then removed. And, in U.S. Pat. No. 5,288,542 (assigned to the same assignee as the present Application), another method is described for making a rigid-flexible circuit board in which a release layer (6) is used during processing and subsequently removed.

The above four patents fail to particularly overcome many of the aforementioned difficulties regarding known processes while assuring the higher densities mandated in today's technology.

It is believed, therefore, that a method of making a circuitized substrate which overcomes the above disadvantages and which can be performed in a facile and relatively inexpensive manner would represent a significant advancement in the art. It is further believed that providing such a method which will further enhance one or more of the unique processes defined in the foregoing cited patent applications will also represent a significant art advancement.

As defined herein, such a method will result in a circuitized substrate capable of: (1) exhibiting relatively high electrical signal propagation speeds; (2) accommodating relatively high I/O chips; (3) exhibiting relatively short "time of flight" electrical signal speeds; and (4) exhibiting a relatively high rate of heat dissipation.

DISCLOSURE OF THE INVENTION

It is, therefore, an object of this invention to provide a method of making a circuitized substrate capable of being used as a chip carrier assembly which can be performed in a facile and relatively inexpensive manner in comparison to existing carrier manufacturing processes.

It is a more particular object of the invention to provide such a process which is readily adaptable to existing manufacturing equipment without extensive modification thereof.

In accordance with one aspect of this invention, there is defined a method of making a circuitized substrate comprising providing an electrically insulative base member having first and second opposing surfaces, depositing a first layer of metallization onto at least one of the first and second opposing surfaces, positioning a photoimageable member onto the first layer of metallization, the photoimageable member including a layer of photoimaging material and a sacrificial dielectric layer thereon, exposing selected portions of the photoimaging material through the sacrificial dielectric layer to provide a pattern within the photoimaging material, removing a selected portion of the base member to form an open cavity therein having sidewalls, depositing a second layer of metallization onto the sidewalls of the open cavity, removing the sacrificial dielectric layer, removing selected portions of the photoimaging material corresponding to the pattern, depositing a third layer of metallization onto the first and second layers of metallization, removing the selected portions of the photoimaging material corresponding to the pattern to expose selected parts of the first layer of metallization and removing the selected parts of the first layer of metallization.

In accordance with another aspect of the invention, there is defined a method of making a circuitized substrate which comprises the steps of providing an electrically insulative base member having first and second opposing surfaces, depositing a first layer of metallization onto at least one of the first and second opposing surfaces, positioning a photoimageable member onto the first layer of metallization, the photoimageable member including a layer of photoimaging material and a sacrificial dielectric layer thereon, removing a selected portion of the base member and the photoimageable member to form an open cavity therein having sidewalls, depositing a second layer of metallization onto the sidewalls of the open cavity, removing the sacrificial dielectric layer, exposing selected portions of the photoimaging material to provide a pattern within the photoimaging material, removing first selected portions of the photoimaging material corresponding to the pattern, depositing a third layer of metallization onto the first and second layers of metallization, removing remaining portions of the photoimaging material to expose selected parts of the first layer of metallization, and removing the selected parts of the first layer of metallization.

BRIEF DESCRIPTION OF THE DRAWINGS

FIGS. 1–13 represent the various steps of making a circuitized substrate in accordance with a preferred embodiment of the invention.

BEST MODE FOR CARRYING OUT THE INVENTION

For a better understanding of the present invention, together with other and further objects, advantages and capabilities thereof, reference is made to the following disclosure and appended claims in connection with the above-described drawings.

As understood from the following, the invention defines a method of making a circuitized substrate and resulting chip carrier wherein the resulting chip carrier is particularly designed to accommodate wire bond-type chips. The carrier produced in accordance with the teachings herein is capable of: (1) exhibiting relatively high electrical signal propagation speeds; (2) accommodating relatively high I/O chips; (3) avoiding the need for multiple manufacturing set-up operations heretofore associated with multi-tiered wire bond packages (as well as achieving a relatively short "time of flight" for electrical signals propagating through the wire bonds); and (4) assuring a relatively high rate of heat dissipation. In particular, the chip carrier produced in accordance with the preferred method taught herein achieves relatively high electrical propagation speeds because it employs organic materials, such as fiberglass-reinforced epoxy resins (in the trade also referred to as "FR4"), polytetrafluorethylene (e.g., Teflon), etc. in lieu of ceramic materials. (Teflon is a trademark of E.I. duPont deNemours and Company.) The resulting chip carrier also accommodates relatively high I/O count chips because it uses at least one organic photoimageable dielectric layer in which photo-vias may be formed to electrically interconnect two (or more) layers of fan-out circuitry. The resulting chip carrier achieves a relatively short "time of flight" for electrical signals propagating through the wire bonds. The invention may further provide enhanced heat sinking for such a structure through the attachment of a sound heat conductor (e.g., copper sheet) to one side of the substrate and placement of the chip (or chips) in thermal contact therewith.

Figure 1:
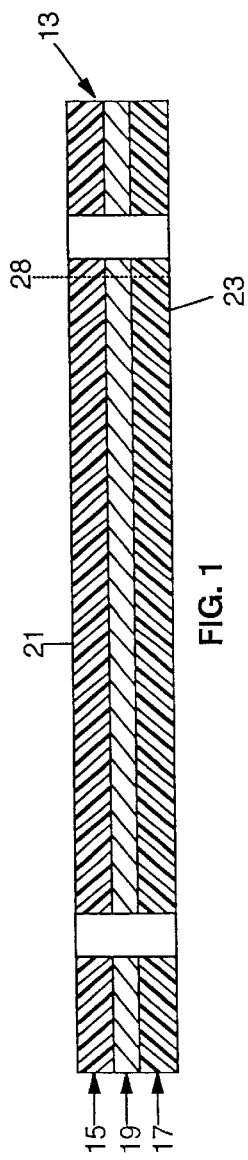

In FIG. 1, there is shown an electrically insulative base member 13 which may be used in the present invention to produce a chip carrier product (described below). It is understood that the invention is not limited to the particular configuration shown in FIG. 1, as others are readily possible. Base member 13 includes first and second dielectric layers 15 and 17 which sandwich therebetween a conductive layer 19. In a preferred embodiment, each of the two dielectric layers is comprised of fiberglass reinforced epoxy resin (often referred to in the industry simply as "FR4") and each possess a thickness of from about 2 mils (thousandths) to about 20 mils. Thicknesses less than about 2 mils for this particular material may be undesirable because the resulting structure may be flimsy and difficult to handle during subsequent manufacturing processes. Thicknesses greater than about 20 mils may be undesirable because such thick dielectric layers, in addition to requiring relatively large conductor line widths and thicknesses, also may prevent optimum package electrical performance.

Sandwiched between dielectric layers 15 and 17 is at least one conductive layer 19, preferably of copper or other well-known conductive material and possessing a thickness of preferably within the range of about 0.125 mils to about 2.5 mils. The thicknesses for layer 19 of less than 0.125 mils may prove undesirable should the resulting structure be subjected to relatively high temperatures. Additionally, thicknesses greater than 2.5 mils may prove undesirable because of the additional time necessary to form such layers using conventional plating techniques and associated difficulties with line width control.

The resulting structure shown in FIG. 1 thus preferably possesses a thickness within the range of only about 4.125 mils to about 42.5 mils. More preferably, a thickness of about 24 mils is used.

Dielectric layers 15 and 17 are bonded to the conductive layer 19 using a lamination process, such a process known in the art and further description is not believed necessary.

Base member 13 is thus shown to include at least two opposing surfaces 21 and 23. Although two dielectric layers are shown for base member 13, it is understood that the invention is not limited thereto. Specifically, it is only necessary to provide one such layer while still attaining the advantageous results taught herein. At least two layers are used when it is desired to incorporate an internal conductive (e.g., power, ground or signal) plane 19 as part of the final structure. Understandably, several dielectric layers and corresponding internal conductive layers may be utilized, depending on operational requirements for the finished product.

Figure 2:
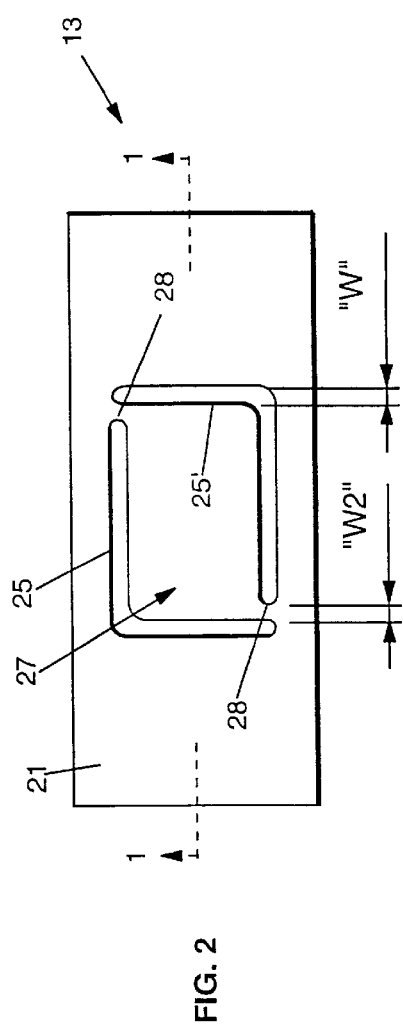

In FIG. 2 (a plan view of the base member 13 of FIG. 1 but on a smaller scale for illustration purposes), a pair of L-shaped slots 25 and 25' are formed within member 13. As understood, these slots serve to substantially define the ultimate boundaries of an opening (described below) to be provided in member 13 such that the member can accommodate a semiconductor chip positioned within this opening and electrically coupled to circuitry (described below) of member 13. As seen in FIG. 2, these slots 25 and 25' define a substantially rectangular (e.g., preferably square) portion 27 within base member 13, which hereinafter will be referred to as a temporary support portion.

Although a substantially rectangular shape is shown for temporary support portion 27 in the plan view of FIG. 2, other shapes are readily possible, depending on the ultimate chip configuration and the method of coupling this chip to the final product's electrical circuitry. In one example, the resulting opening (51, FIGS. 9–16) of this support portion possessed (when removed) width and length dimensions each within the range of about 500 to about 700 mils, with each of the slots 25 and 25' possessing an average width ("W" in FIG. 2) of only about 60 mils.

In the broader aspects of the invention, it is possible to provide only a singular slot within member 13 (e.g., to define a substantially cylindrical support portion) thereby allowing only one nonremoved segment.

The preferred means for providing slots 25 and 25' is to use a routing process using conventional routing equipment, further description thus not believed necessary. In one embodiment, the two non-removed parts 28 each possessed a width ("W2" in FIG. 2) of only about 40 mils. (Notably, the slots 25 and 25' are shown in larger scale in FIGS. 1, 3 and 4, again for illustration purposes.)

Figure 3:
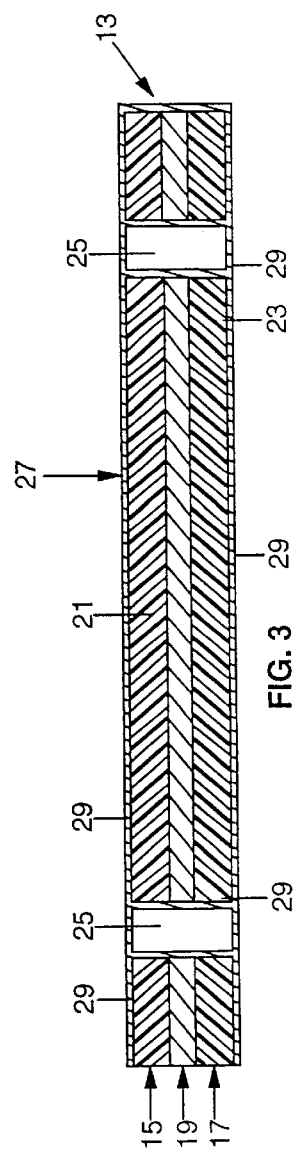

In the next step (FIG. 3), it is preferred to provide a metallized, thin seed layer on the surfaces 21 and 23 of base member 13, and also on the internal surfaces of individual slots 25 and 25'. As seen in FIG. 3, this thin seed layer (29) material extends through the entire thickness of member 13. The preferred material for seed layer 29 is palladium-tin. Understandably, the described seed layer serves to enhance subsequent positioning of the invention's conductive circuitry (described below). By the term "thin" as used herein is meant a thickness for seed layer 29 within the range of about 40 to 60 angstroms.

As mentioned above, a key attribute of the present invention is its adaptability to many existing technologies, e.g., those used in mass production, by allowing the invention as defined herein to benefit from the several advantages thereof One particular process involves what is referred to as a dry film resist operation in which the photoresists used are applied in dry film form (as opposed to liquid film application, another known process). Typically, such films are removed from supply rollers and aligned with respective surfaces of the substrates being treated. Such a process has become widely accepted in the field, and further description is not believed necessary.

In FIG. 4, two photoimaging members 31 and 31', each comprising a layer of dry film photoimaging (photoresist) material 32 and thin layer 32' of dielectric film material (e.g., Mylar) are shown as being positioned on the respective opposing surfaces of member 13. In one example, each layer of photoresist material possessed a thickness of only from about 0.6 mils to about 2.0 mils. A preferred material is a negative-acting photoresist, various examples being known in the art, including Photoresist 3120 and Photoresist T168, both available from E.I. duPont deNemours and Company under these product names. Negative-acting photoresists, when applied and exposed through a suitable photomask, undergo a physical and chemical change in the exposed areas that render these areas insoluble to the subsequent developing solution which is to be applied thereto. The thin removable film layer 32' forms part of these members and functions as a sacrificial member as defined hereinbelow. Provision of such a layer also facilitates photoresist handling. A critical aspect of this invention is that the film layer is not removed after the exposure step, but instead remains on the member throughout at least the next few processing steps.

FIG. 4 also illustrates that the photoimaging material 32 and 32' functions as a spacer between the substrate's outer surfaces and the photoimageable member's sacrificial layers 32'.

In FIG. 5, base member 13 is shown following the removal of the temporary support portion 27 (FIG. 2) using preferably a punching operation. Alternatively, routing may be used. In both processes, corresponding parts of the two-layered photoimageable member is also removed. A much larger cavity 34 results, including two (one shown) thin strips 35 of metallization which covers the part of the sidewalls previously occupied by parts 28 (FIG. 2).

In FIG. 6, a second thin metallization (seed) layer 36 is applied to all surfaces in a non-ultraviolet (e.g., yellow room) environment. This thin seed layer is preferably of the same or similar material as the first metallization layer applied in the step of FIG. 3. Thin seed layer 36 provides metallization on all of the cavity's sidewalls.

In FIG. 7, the thin film 32' (e.g., Mylar) has been removed, preferably by peeling. Very significantly, such removal in turn removes the second thin seed metallization layer 36 on surfaces previously covered by the film, but leaves the thin seed layer 36 on the cavity's sidewalls.

With attention again to FIG. 4, the photoimageable members 31 and 31' are each applied across the entire outer, opposing surfaces of member 13, including over the 60 mil wide slots 25 and 25' (FIG. 2) and the upper and lower surfaces of temporary support portion 27. The two layers of each member bridge the L-shaped slots 25 and 25' without bowing or otherwise extending within the slots. Heretofore, when larger openings (e.g., 500 mils×500 mils) were provided in the base member 13, such dry film photoresists were incapable of spanning ("tenting") the relatively large widths of such openings. The undesirable result was a sagging or similar disfiguration of the photoresist, rendering subsequent processing extremely difficult and often impossible. Further, the use of such a large spanning structure resulted in what may be described as "doubling over" of the resist when subjected to the subsequent developing operations in which various relatively high spray pressures of the developer are used, spraying being the preferred technique for providing such developer. As a result, inadequate development processes resulted with photoresist residues occasionally remaining on the parts to in turn result in unacceptable product yield rates. Previous attempts to minimize this problem through the adjustment of the exposure pattern for the photoresist or to reduce these pressures in the development step proved unsuccessful in providing consistent improvement. The layers 32 and 32' of each of the invention's photoimageable members are shown as easily bridging (spanning) the respective slots 25 and 25' in FIG. 4, such that the aforementioned problems are eliminated.

As mentioned, although a negative-acting photoresist procedure has been described, the invention is not limited thereto. It is also possible to instead use positive-acting photoresists in which the exposed areas thereof under the photomask, when immersed in the developing solution, are removed. Such photoresists may also be applied in film (sheetlike) form, as are negative-acting photoresists. It is thus seen that the present invention is adaptable to more than one accepted technology. Exposure of the photoresist layers 32 now occurs using standard photolithographic equipment and steps. Significantly, such exposure may occur either before removal of the sacrificial thin Mylar layer 32', or shortly thereafter (as described immediately above). If the former, exposure is possible through the transparent Mylar, thus allowing the Mylar to remain and protect the photoresist (e.g., during subsequent handling, processing, etc.).

Following exposure, the resist-coated base member 13 is immersed in an appropriate developing solution (e.g., sodium carbonate, propylene carbonate), which allows the unexposed areas to be removed without excessive impact on the hardened, exposed area. Baking or other processes may be used at this stage to further harden the remaining, exposed portions, if desired.

In FIG. 8, base member 13 is shown following the partial (developed) photoresist removal operation. As such, only portions of photoresist layers 32 and 32' remain, these portions defining a pattern which will eventually represent the end product's circuitry. These remaining portions are represented by the numerals 33 (those on the upper surface) and 33' (those on the lower surface). It is understood that the removed portions of the photoresist in turn result in openings (35) which, in turn, expose preselected areas on the respective adjacent surfaces on which circuitization is to eventually occur to form the product's circuitry. Thus a predetermined pattern on both surfaces is provided.

In FIG. 9, member 13 has been subjected to a metallization process in which a third layer of metallization (e.g., copper or similarly conductive metal) 41 is deposited in the exposed portions (e.g., in openings 35) remaining following development and removal of the desired portions of photoresist 32 and 32'. In a preferred embodiment, this metallization (which will form at least part of the circuitry for member 13) is deposited using a plating process, and more preferably an additive plating process. Additive plating is well known in the art and further description is not believed necessary. This process may also be referred to in the art as a wet copper plating process. Other plating and/or photolithographic techniques may of course be utilized in place of that mentioned above. For example, positive acting photoresists (as mentioned above) and negative acting photoresists used in conventional subtractive circuitization processes may be used. It is understood that either electroplating or electroless plating may be used to form the circuitry in accordance with the teachings of the present invention. In one embodiment, the deposited copper 41 on the upper and lower surfaces of member 13 and on the sidewalls of 25' may possess a thickness of only from about 0.5 mils to about 2.0 mils. The aforementioned palladium-tin seed layer 29 is, understandably, covered by metallization 41. It is understood, however, that this layer is present and has remained on the exposed surfaces of member 13.

Significantly, in FIG. 9, the exposed upper surfaces defining the conductor channels are plated to the same height (thickness) as the adjacent, remaining photoresist portions 33. Equally important, the plating of the cavity sidewalls is also of uniform thickness adjacent the two dielectric layers 15 and 17, and the internal conductive plane 19. Industry requirements may vary for final plating height (e.g., from 0.5 mil to 2.0 mil) and is generally limited by the thickness of the photomask being used to define the circuitization. For an additive process, the thickness in the conductor channels and cavity sidewalls will be similar and limited by the photoresist thickness and the ability of the plating process to uniformly deposit metal on the surface, in the plated through holes and cavity. For a process that plates at 100% throwing power (plating on surface is the same as in the PTH's or sidewalls), this invention provides the ability to plate a uniform copper thickness on all exposed surfaces.

In FIG. 10, the remaining portions 33 and 33' of photoresist are removed. A preferred step for doing so is to use a solution similar to the developing solution (e.g., sodium carbonate, propylene carbonate, benzyl alcohol) but at an elevated temperature compared to the prior developing operation. Such removal leaves exposed portions of the first layer 29 of metallization between the respective conductors 41 formed by the foregoing metallizations. These conductors may be in the form of extended signal lines, small size diameter conductor pads, etc. In the embodiment of FIG. 10, such electrically conductive elements are understandably electrically connected by this initial metallization layer 29, which, of course, would be unacceptable for subsequent product operation.

Consequently, in FIG. 10A, these remaining exposed portions of metallization 29 are removed (except for under the overlying conductors 41). A preferred process for effecting such removal is to use a solution that preferentially complexes with the palladium/tin. One method well known in the industry is to use a solution containing a cyanide salt at a concentration high enough to complex the available palladium/tin. The result is a plurality of conductive elements 41 in the form of lines and/or pads (as described) on the outermost, external (upper and lower) surfaces of member 13, these elements substantially surrounding the internal positioned opening (now referenced as numeral 51) which, as understood, is entirely conductive. In one embodiment of the invention, these conductive elements may possess a width of only about 0.5 to 5.00 mils, while it is possible to provide corresponding conductive lines having a length of at least 0.25 mil to 100 mils.

At this point, it may also be desirable to selectively apply a fourth layer 53 of metallization in the form of a precious metal (e.g., gold) 53 (FIG. 11) to various parts of the respective conductive elements formed on the upper and lower surfaces of member 13. Other metals for this purpose may include palladium cobalt, nickel or combinations thereof (with gold). A desired thickness for this fourth metal is within the range of only from about 0.04 to about 0.25 mils. Such application is preferably performed by an additive plating process such as described above, a preferred process being electroless plating. Electrolytic plating is also possible. Such additional plating is particularly desired for those surfaces of the circuitry designed to receive the highly conductive, fine wires (described below) which will eventually couple a semiconductor chip (also described below) to this circuitry. Using suitable masking, it is possible to only selectively plate the invention's outer conductors and thereby exclude plating the relatively large internal opening 51. Although all surfaces are shown in FIGS. 11–13 as having such metal thereon, preferably (for cost reasons) only the upper surfaces of each conductive member 41 designated to have such a wire bonded thereto are covered.

In the event that it is desired to provide a heat sinking and/or stiffening member, such a member, represented by the numeral 61 in FIG. 12, may be simply bonded to the bottom surface (including the respective conductors 41 if present) of member 13. In one embodiment, this member 61 was comprised of a 14 mil thick copper sheet which was secured to member 13 using an epoxybased adhesive represented by the numeral 63. Several adhesives are possible, as are several different metals (e.g., aluminum) for member 61.

(Although a second, bottom electrically conductive layer is shown in the embodiments depicted herein, it is understood that, in its broadest aspects, the invention may only utilize a singular (e.g., upper) conductive layer. Should this be the situation, the heat sink and/or stiffener 61 would understandably be directly attached to the lower surface of the bottom dielectric layer 17.)

Figure 13:
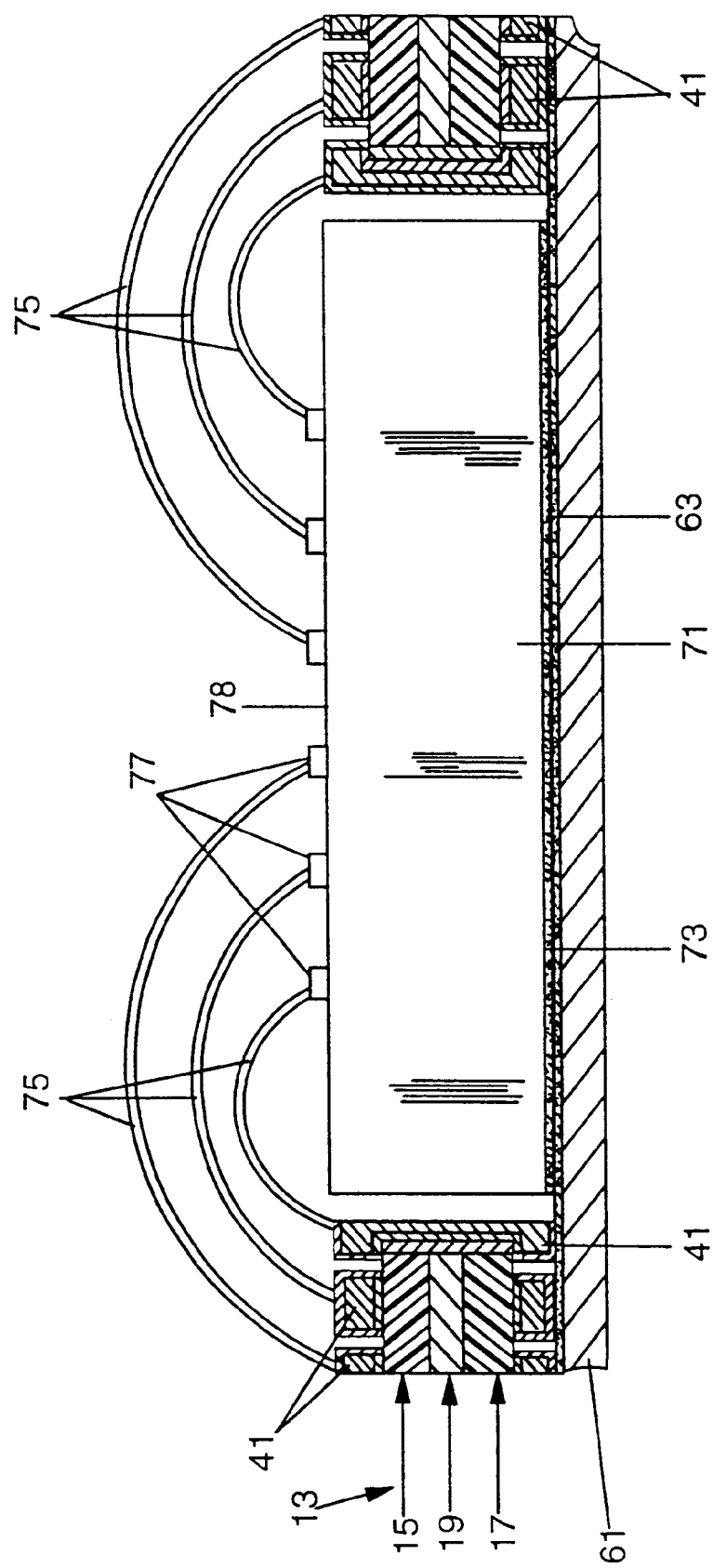

The member 13 in FIG. 12 is now ready to receive an integrated circuit (semiconductor) chip, such as shown in FIG. 13 (the chip represented by the numeral 71). Preferably, chip 71 is bonded to the heat sinking and/or stiffening member 61 using a second adhesive 73, a preferred adhesive being of the thermally conducting type which, in a preferred embodiment, is a commercially available silver-impregnated epoxy sold under the trade designation Ablebond 9651-L by Ablestick Corporation. Adhesive 63 is also shown in FIGS. 12 and 13 and can also be used to bond chip 71 in place. Chip 71 is thus thermally coupled to member 61 to assure enhanced heat removal from the final package structure as produced in accordance with the teachings herein. Bond wires 75 (e.g., gold) may now be provided to electrically couple contact sites 77 on the chip's upper surface 78 to corresponding respective ones of the external conductive members 41 which form the upper layer of circuitry for member 13. As seen in FIG. 13, these wires extend from the chip outwardly to this circuitry. The wires 75 are preferably provided using a wirebond process, well known in the art.

If desired, an encapsulant material (not shown) may be provided over the wires and associated pads to provide protection from the occasionally harsh environment to which the product produced by the invention may be exposed. One suitable encapsulant is an epoxy molding material sold by the Dexter-Hysol Company under the trade name Hysol 4450.

FIG. 13 thus illustrates a chip carrier structure which is now capable of being electrically coupled to additional circuit structures (e.g., printed circuit boards) which form part of a larger information handling system (computer) for which the product produced by the invention is particularly suited. One such form of coupling may include solder ball attach in which solder balls (e.g., 90:10 tin:lead) are used to couple respective parts of member 13's circuitry to the circuitry on one/more of such additional circuit structures. Other techniques are of course readily possible for achieving this end.

Thus there has been shown and described a facile method for producing a circuitized substrate for use as part of a chip carrier assembly which is capable of being readily performed using many established processes of the art. The invention thus represents a relatively inexpensive yet effective process for producing chip carrier structures on a mass scale. While the invention has been described with respect to organic dielectric materials, this is not meant to limit the invention in that even inorganic (e.g., ceramic) may be utilized to provide the dielectric function. As stated above, it is also readily possible to utilize alternative procedures (e.g., subtractive circuitization) which are also known in the art, to accomplish the invention.

While there have been shown and described what are at present considered the preferred embodiments of the invention, it will be obvious to those skilled in the art that various changes and modifications may be made therein without departing from the scope of the invention as defined by the appended claims.

What is claimed is:

1. A method of making a circuitized substrate, said method comprising:

providing an electrically insulative base member having first and second opposing surfaces;

depositing a first layer of metallization onto at least one of said first and second opposing surfaces;

positioning a photoimageable member onto said first layer of metallization, said photoimageable member including a layer of photoimaging material and a sacrificial dielectric layer thereon;

exposing selected portions of said photoimaging material through said sacrificial dielectric layer to provide a pattern within said photoimaging material;

removing a selected portion of said base member to form an open cavity therein having sidewalls;

depositing a second layer of metallization onto the sidewalls of said open cavity;

removing said sacrificial dielectric layer;

removing first selected portions of said photoimaging material corresponding to said pattern;

depositing a third layer of metallization onto said first and second layers of metallization;

removing remaining portions of said photoimaging material to expose selected parts of said first layer of metallization; and removing said selected parts of said first layer of metallization.

2. The method of claim 1 further including the step of depositing a fourth layer of metallization onto said third layer of metallization.

3. The method of claim 2 wherein said fourth layer of metallization is deposited using an additive plating process.

4. The method of claim 1 wherein said layer of said photoimaging material of said photoimageable member is positioned in contact with said first layer of metallization and serves to spacedly position said sacrificial dielectric layer from said first layer of metallization.

5. The method of claim 4 wherein said sacrificial dielectric layer is removed using a peeling process.

6. The method of claim 1 wherein said depositing of said first layer of metallization is accomplished using a plating process.

7. The method of claim 6 wherein said plating process is an additive plating process.

8. The method of claim 1 wherein said exposing of said selected portions of said photoimaging material is accomplished using a masking process.

9. The method of claim 1 wherein said photoimaging member is positioned onto said first layer of metallization in sheetlike form.

10. The method of claim 1 further including securing a heat sinking and/or stiffener member to said base member along said second opposing surface.

11. The method of claim 10 wherein said securing of said heat sinking and/or stiffener member is accomplished using an adhesive.

12. The method of claim 10 further including the step of positioning an integrated circuit member within said open cavity within said base member.

13. The method of claim 12 further including positioning said integrated circuit member on said heat sinking and/or stiffener member.

14. The method of claim 12 further including the step of electrically coupling said integrated circuit member to selected areas of one or more of said layers of metallizing.

15. The method of claim 14 wherein said electrical coupling is accomplished using a wire bonding process.

16. The method of claim 1 further including providing a conductive layer within said electrically insulative base member between said first and second opposing surfaces, said conductive layer including an exposed edge portion within said slot extending entirely through said base member.

17. The method of claim 16 wherein said depositing of said second layer of metallizing onto said sidewalls of said open cavity further includes the step of metallizing said exposed edge portion of said conductive layer.

18. A method of making a circuitized substrate, said method comprising:

providing an electrically insulative base member having first and second opposing surfaces;

depositing a first layer of metallization onto at least one of said first and second opposing surfaces;

positioning a photoimageable member onto said first layer of metallization, said photoimageable member including a layer of photoimaging material and a sacrificial dielectric layer thereon;

removing a selected portion of said base member and said photoimageable member to form an open cavity therein having sidewalls;

depositing a second layer of metallization onto the sidewalls of said open cavity;

removing said sacrificial dielectric layer;

exposing selected portions of said photoimaging material to provide a pattern within said photoimaging material;

removing first selected portions of said photoimaging material corresponding to said pattern;

depositing a third layer of metallization onto said first and second layers of metallization;

removing remaining portions of said photoimaging material to expose selected parts of said first layer of metallization; and removing said selected parts of said first layer of metallization.

19. The method of claim 18 further including the step of depositing a fourth layer of metallization onto said third layer of metallization.

20. The method of claim 21 wherein said fourth layer of metallization is deposited using an additive plating process.

21. The method of claim 18 wherein said layer of said photoimaging material of said photoimageable member is positioned in contact with said first layer of metallization and serves to spacedly position said sacrificial dielectric layer from said first layer of metallization.

22. The method of claim 21 wherein said sacrificial dielectric layer is removed using a peeling process.

23. The method of claim 18 wherein said depositing of said first layer of metallization is accomplished using a plating process.

24. The method of claim 23 wherein said plating process is an additive plating process.

25. The method of claim 18 wherein said exposing of said selected portions of said photoimaging material is accomplished using a masking process.

26. The method of claim 18 wherein said photoimaging member is positioned onto said first layer of metallization in sheetlike form.

27. The method of claim 18 further including securing a heat sinking and/or stiffener member to said base member along said second opposing surface.

28. The method of claim 27 wherein said securing of said heat sinking and/or stiffener member is accomplished using an adhesive.

29. The method of claim 28 further including the step of positioning an integrated circuit member within said open cavity within said base member.

30. The method of claim 21 further including positioning said integrated circuit member on said heat sinking and/or stiffener member.

31. The method of claim 30 further including the step of electrically coupling said integrated circuit member to selected areas of one or more of said layers of metallizing.

32. The method of claim 31 wherein said electrical coupling is accomplished using a wire bonding process.

33. The method of claim 18 further including providing a conductive layer within said electrically insulative base member between said first and second opposing surfaces, said conductive layer including an exposed edge portion within said slot extending entirely through said base member.

34. The method of claim 33 wherein said depositing of said second layer of metallizing onto said sidewalls of said open cavity further includes the step of metallizing said exposed edge portion of said conductive layer.

* * * * *